United States Patent [19]
Adam

[11] Patent Number: 4,873,484
[45] Date of Patent: Oct. 10, 1989

[54] EXTENDED RANGE COMPOSITE HEAD POWER SENSOR WITH THREE CIRCUIT BRANCHES HAVING A COMMON NODE

[75] Inventor: Stephen F. Adam, Los Altos, Calif.

[73] Assignee: Lucas Weinschel, Inc., Gaithersburg, Md.

[21] Appl. No.: 92,755

[22] Filed: Sep. 3, 1987

[51] Int. Cl.$^4$ .................... G01R 15/08; G01R 21/00; G01R 21/10
[52] U.S. Cl. ........................................ 324/95; 324/115
[58] Field of Search ............... 324/58 R, 95, 115, 119, 324/133; 340/661

[56] References Cited

U.S. PATENT DOCUMENTS

| | | | |
|---|---|---|---|
| 2,779,869 | 1/1957 | Gerks | 340/661 X |
| 3,295,022 | 12/1966 | Schelisch | 324/95 X |
| 3,537,004 | 10/1970 | Strock | 324/115 |
| 4,044,303 | 8/1977 | Reindel | 324/95 |
| 4,110,687 | 8/1978 | Sneed, Jr. | 324/133 |
| 4,520,310 | 5/1985 | Kelly et al. | 324/115 |
| 4,642,558 | 2/1987 | Batchman et al. | 324/95 X |

FOREIGN PATENT DOCUMENTS 1245641 9/1971 United Kingdom ................ 324/115

OTHER PUBLICATIONS

Kruppa, R. W. Null Type Minimum Indicator with Automatic Ranging, *IBM Technical Disclosure Bulletin*, vol. 12, No. 9, Feb. 1970, pp. 1413,1414.

*Primary Examiner*—Gerard R. Strecker
*Attorney, Agent, or Firm*—Shlesinger & Myers

[57] ABSTRACT

A probe for sensing radio frequency power, utilizing two independently-driven radio frequency-sensitive diodes. The two diodes are driven through a common RF input, through a branch network which separates and feeds the probe RF power to each diode independently. The diodes are unequally padded from the RF input, to provide an extended sensitivity range for the probe. One diode, therefore, operates in a lower dBm range, while the other diode operates in a higher dBm range. Two separate outputs are provided from the probe to supply a common power meter which monitors the appropriate output for the present power level of the radio frequency input.

14 Claims, 1 Drawing Sheet

EXTENDED RANGE COMPOSITE HEAD POWER SENSOR WITH THREE CIRCUIT BRANCHES HAVING A COMMON NODE

BACKGROUND OF THE INVENTION

The present invention relates to power level measurement devices. More specifically, the present invention relates to the sensor or probe head portion of a power level detector, which is physically exposed to the incident radio frequency power level.

Radio frequency detectors often utilize Schottky barrier diodes for power level measurement in the radio frequency spectrum. The detection characteristics of such diodes utilized for power level measurement is limited to approximately a 50 dB usable dynamic range, typically in the −70 dBm to −20 dBm range. This range limitation is characteristic of diode utilization for signal detection, limited to stay within its square law range.

SUMMARY OF THE INVENTION

The present invention utilizes two independent diodes supplied from a common RF source through a power divider. The diodes are unequally padded from the power input so that each diode produces a separate usable dynamic range offset from the other diode. The lower end of the higher range overlaps the upper end of the lower range, thereby combining to provide a broader dynamic range than that attainable through utilization of a single diode.

The utilization of a power head having a high level and low level sensor integrated into a single head provides for a single RF connection which thereby minimizes mismatch, calibration factor and range change uncertainties which would be associated with switching between two separate independent sensors, one for high level and one for low level detection.

Further, the probe taught by the present invention allows power detection over a broader dynamic range without necessitating a probe change with associated recalibration.

The present invention is now described with respect to certain embodiments as illustrated in the following drawings:

BRIEF DESCRIPTION OF THE DRAWINGS

For a further understanding of the nature and objects of the present invention, reference should be had to the following detailed description taken in conjunction with the accompanying drawings in which like parts are given like reference numerals and wherein.

DETAILED DESCRIPTION OF A PREFERRED EXEMPLARY EMBODIMENT

Figure 1:
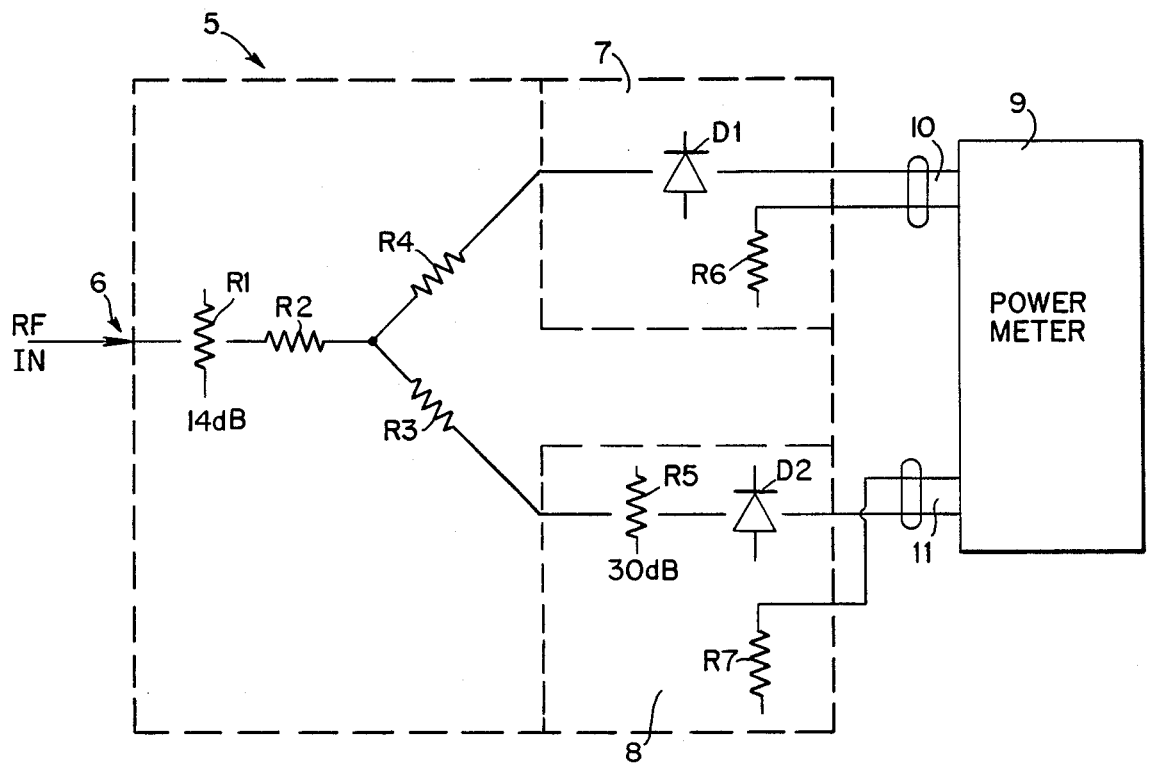
FIG. 1 is a schematic diagram illustrating the major components of the probe connected to a power meter.

The probe 5 as illustrated in FIG. 1, contains a single RF input 6. Resistor R1 is utilized as an initial 14 dB pad. The RF signal is then fed to a power divider consisting of Y-connected resistors R2, R3 and R4, with resistor R2 forming the leg of the Y. A first branch of the power divider is fed through resistor R4 and supplies the RF signal to the low level signal detection circuit 7 of the probe 5. The signal supplied through resistor R3 is supplied to a high level signal detection circuit 8 of the probe 5.

Both the low and high level detection circuits 7 and 8 are incorporated in the single probe 5 with a single common RF input 6 and are connected to a commercially available two-channel power meter 9 through coaxial lines 10 and 11, respectively.

Figure 2:
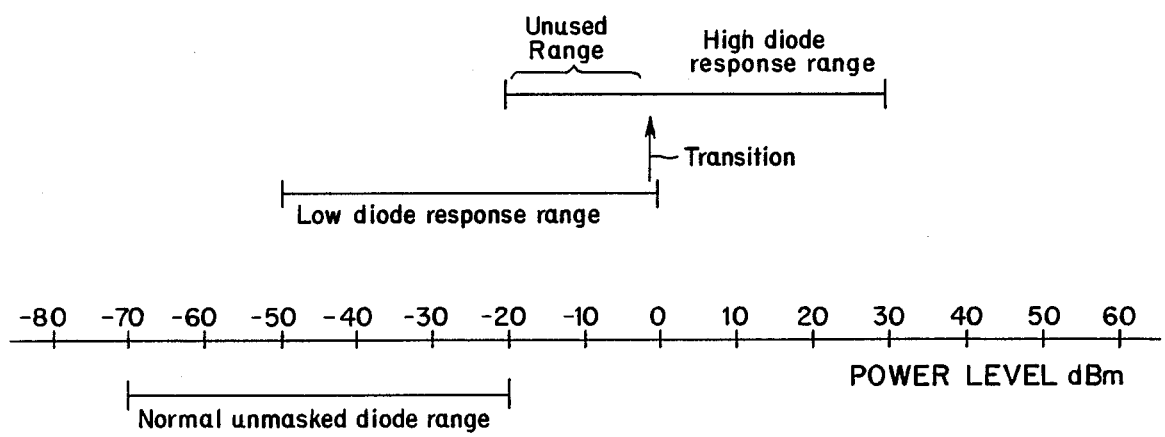
FIG. 2 graphically illustrates the increased dynamic range provided by the probe of the present invention.

The low level diode D1, after RF masking provided by resistor R1 and divider branches resistors R2 and R4, provides a dynamic response in the range of −50 dBm to 0 dBm, as illustrated in FIG. 2. High level diode D2 is masked by resistors R1, R2, R3 and R5 to provide a response range from approximately −20 dBm to +30 dBm. In this manner, the dynamic response ranges of D1 and D2 overlap in the −20 to 0 dBm range. The response of the high level circuit in this latter range is suppressed so as to provide a broad cross-over range.

The input RF signal level experiences an effective 20 dB loss between input 6 and the low level diode D1, as a result of the 14 dB initial input padding of resistor R1 provided for good matching characteristics, and the losses associated with the power divider branches comprised of resistors R2 and R4.

The input RF signal level experiences an effective 40 dB loss (20 dB more than the low range circuit) between input 6 and high level diode D2, as a result of the 14 dB initial input padding resistor R1 and the losses associated with resistors R2 and R3 and the secondary mask resistor R5. The 40 dB loss is 20 dB greater than the loss in the low level range, thus reducing response to the high level circuit in the −20 dB to 0 dB range to provide a broad cross-over range.

Range contral resistors R6 and R7 are provided to indicate to the 8800A power meter which input line is supplying the low and which the high power level detection and to indicate to the power meter the specific range of each signal. Range resistors R6 and R7 are, therefore, of different value to provide a comparison indication.

The Weinschel Engineering power meter 9 identifies the separate outputs of the split probe 5 through the differences in the values of the range resistors R6 and R7. For power measurements in the 0 to +30 dBm range the meter 9 will interpret the inputs from the high level diode D2, input on coaxial line 11. For the remaining usable response range of −50 dBm to 0 dBm the low level diode D1 output, on line 10, is utilized by the meter 9. A transition, as illustrated in FIG. 2, is therefore performed at the 0 dBm level wherein the meter 9 switches to/from monitoring coaxial input line 10 or line 11, as appropriate.

When the power input at the RF connector 6 is rising from a level below 0 dBm, the low level diode D1 output line 11 will be monitored by the meter 9. Once the upper threshold of the low range is reached at the top range of the low-level sensor, the meter 9 will cease to monitor line 11 and will begin to monitor input line 10, thereby receiving signals in the middle range of the high-level diode D1. Monitoring of line 11 will continue until the power level has exceeded the workable dynamic range of the probe 5.

If the power level detected at the RF input 6 is initially in the 0 to +30 dBm range, the meter 9 will monitor the high-level diode D2 input line 11. If the power level then falls such that the low threshold is reached in the middle range of the high level diode dynamic range, the meter 9 will switch to monitoring the input line 10 from the low diode D1. The meter 9 will then, at 0 dBm, monitor the low level diode D1 output down to the maximum extent of the usable dynamic range of the probe 5.

The two-diode detector probe 5, as taught by the present invention, does not require linearization correction, as would be needed for a thermocouple head. Also, the 20 dB isolation for the low-level diode D1 is sufficient to protect the diode D1 from damage, even at the maximum power level of +30 dBm. The diode D1 will be driven into the non-linear region without resultant damage.

The operating range of the probe can be extended to −b 60 dBm or −70 dBm by use of an alternative value for R1. If a 4 dB pad is substituted for the 14 dB pad R1, then head D1 operates in the −60 dBm to −10 dBm range. If no masking is utilized to pad head D1, then its response is in the −70 dBm to −20 dBm range, as illustrated in FIG. 2. Compensation for R2 and R4 must be made to achieve zero padding. An appropriate increase in R5, will compensate to allow D2 to continue to operate at −20 to +30 dBm.

Calibration for these two embodiments is provided at −10 or −20 dBm, where the ranges of both heads overlap. In this manner a sensor with a range of −70 dBm to +30 dBm is provided.

Both the high and low-level diode outputs can be calibrated simultaneously from a 1 mW source, since both are simultaneously attached. This arrangement alleviates the need for recalibration each time separate heads would need to be attached and detached, for measurement in an extended range.

Once given the above disclosure, many other features, modifications and improvements will become apparent to the skilled artisan. Such features, modifications and improvements are thus to be considered as part of this invention, the scope of which is to be determined by the following claims. The embodiments, herein detailed in accordance with the descriptive requirements of the law, are to be interpreted as illustrative and not in a limiting sense.

I claim:

1. A power sensor for detecting the power of a signal from a signal source, comprising:
    (a) circuit means for dividing said signal having first, second and third branches having a common node, said first branch comprising first and second resistors, said first branch extending between the node and input means for receiving said signal,
    said second branch comprising a third resistor connected in series with a first diode for conduction of a signal within a first predetermined power range,
    said third branch comprising fourth and fifth resistors connected with a second diode for conduction of a signal within a second predetermined power range; and
    (b) said second and third branches extending from said node to output means responsive to the signals on said second and third branches for providing an output signal characteristic of the power level of the signal from the signal source.

2. The power sensor of claim 1 wherein:
said first diode and said second diode are unequally padded from said input means.

3. The power sensor of claim 2, wherein;
said conduction signal from said first diode is indicative of the power level of said source signal when said source signal power level is in the range of −50 dBm to 0 dBm, and
said conduction signal from said second diode is characteristic of the power level of said source signal when said source signal input is in the −20 dBm to +30 dBm range.

4. The power sensor of claim 2, wherein:
said conduction signal from said first diode is indicative of said RF input power level when said RF input power level is in the range of −60 dBm to −10 dBm, and
said output of said second diode is characteristic of the power level of said radio frequency input when said radio frequency input is in the −20 dBm to +30 dBm range.

5. The power sensor of claim 2, wherein:
said conduction signal from said first diode is indicative of said RF input power level when said RF input power level is in the range of −70 dBm to −20 dBm, and
said output of said second diode is characteristic of the power level of said radio frequency input when said radio frequency input is in the −20 dBm to +30 dBm range.

6. The power sensor of claim 3, wherein:
said divider circuit is comprised of three equally balanced branches, further comprising:
an input mask connected between said first branch and said input means, and wherein said fifth resistor is a second mask.

7. The power sensor of claim 6, wherein:
the combined resistance of said input mask said first branch and said second branch provides a minimum of 20 dB padding between said input means and said first diode.

8. The power sensor of claim 6, wherein:
the combined resistance of said input mask, said first branch and said third branch provides a minimum of 50 dB padding between said input means and said second diode.

9. The power sensor of claim 1, wherein:
said output means is a power meter being configured to select said first signal when said input signal is below 0 dBm and to select said second signal when said input signal is above 0 dBm.

10. The power detector of claim 1 further comprising means for transmitting the signal and where said first, second and third branches form a Y connection and said second predetermined power range is contiguous to the first predetermined range.

11. The power detector of claim 1 wherein said signal source is a radio frequency source and
said circuit means is operative over an extended signal power range.

12. The power detector of claim 10 wherein said first branch is connected to said input means.

13. A power sensor for determining the power level of a signal from a signal source, comprising:
    (a) input means for receiving the signal from said signal source;
    (b) circuit means for dividing the power of the signal having first, second and third branches having a common node,
    said first branch coupled to said input means and comprising first and second resistors,
    said second branch comprising a third resistor connected in series with first diode for conduction of a signal within a first predetermined power range,
    said third branch comprising fourth and fifth resistors connected with a second diode for conduction of a signal within a second predetermined power range; and (c) output means electrically connected to said second and third branches for providing an output signal characteristic of the power level of the signal produced by the signal source.

14. A power sensor for determining the power level of a signal from a signal source, comprising:

(a) input means for receiving the signal from said signal source, (b) circuit means for dividing the power of the signal produced by the signal source having first, second and third branches having a common node, said first branch coupled to said input means and comprising first and second resistors, said second branch comprising third and fourth resistors connected with a first diode for conduction of a signal within a first predetermined power range, said third branch comprising fifth, sixth and seventh resistors connected with a diode for conduction of a signal within a second predetermined frequency range, (c) output means electrically connected to said fourth and seventh resistors whereby said fourth and seventh resistors provide an indication to the output means of the specific ranges of power across said second and third branches.

* * * * *